United States Patent
Tirén et al.

(10) Patent No.: US 10,319,553 B2
(45) Date of Patent: Jun. 11, 2019

(54) METHOD FOR CONTROLLABLY GROWING ZNO NANOWIRES

(71) Applicant: Lightlab Sweden AB, Uppsala (SE)

(72) Inventors: Jonas Tirén, Uppsala (SE); Jan-Otto Carlsson, Uppsala (SE); Helena Tenerz, Uppsala (SE); Patrik Hollman, Uppsala (SE)

(73) Assignee: Lightlab Sweden AB, Uppsala (SE)

( * ) Notice: Subject to any disclaimer, the term of this patent is extended or adjusted under 35 U.S.C. 154(b) by 0 days.

(21) Appl. No.: 16/084,433

(22) PCT Filed: Mar. 14, 2017

(86) PCT No.: PCT/SE2017/050246
§ 371 (c)(1),
(2) Date: Sep. 12, 2018

(87) PCT Pub. No.: WO2017/160212
PCT Pub. Date: Sep. 21, 2017

(65) Prior Publication Data
US 2019/0080869 A1 Mar. 14, 2019

(30) Foreign Application Priority Data
Mar. 16, 2016 (SE) ..................... 1650356

(51) Int. Cl.
*H01J 9/02* (2006.01)
*H01L 21/02* (2006.01)
*B82Y 30/00* (2011.01)

(52) U.S. Cl.
CPC ........ *H01J 9/025* (2013.01); *H01L 21/02554* (2013.01); *H01L 21/02603* (2013.01);
(Continued)

(58) Field of Classification Search
CPC ............... H01J 9/025; H01L 21/02554; H01L 21/02603; H01L 21/02614; H01L 21/022; H01L 21/02
See application file for complete search history.

(56) References Cited

U.S. PATENT DOCUMENTS 8,227,957 B2 * 7/2012 Choi ................... H02N 2/18
310/339
8,278,800 B2 * 10/2012 Abramovich ............. E01B 3/00
310/339
(Continued)

FOREIGN PATENT DOCUMENTS

EP 1709665 A1 10/2006
KR 20050005122 A 1/2005

OTHER PUBLICATIONS

International Search Report and Written Opinion for International Application No. PCT/SE2017/050246 dated May 30, 2017, 10 pages.

*Primary Examiner* — Annie M Hines
(74) *Attorney, Agent, or Firm* — RMCK Law Group, PLC (57) ABSTRACT

The present invention relates to a method for controllably growing ZnO nanowires, for example to be used in relation to field emission lighting. In particular, the invention relates to a method of controlling thermal oxidation conditions to achieve steady-state conditions between an oxygen consumption rate by a growing oxide on a surface of a structure and the decomposition rate of the oxygen-carrying species within the chamber. The invention also relates to a corresponding field emission cathode.

21 Claims, 3 Drawing Sheets

(52) U.S. Cl.
CPC ........ *H01L 21/02614* (2013.01); *B82Y 30/00* (2013.01); *H01J 2201/30446* (2013.01)

(56) References Cited

U.S. PATENT DOCUMENTS

| | | | |
|---|---|---|---|
| 8,421,052 B2* | 4/2013 | Wang | ............... H04R 17/02 |
| | | | 257/24 |
| 9,978,834 B2* | 5/2018 | Holland | .............. H01L 29/0676 |
| 2003/0213428 A1 | 11/2003 | Lu et al. | |
| 2011/0163636 A1 | 7/2011 | Sirbuly et al. | |
| 2014/0202378 A1 | 7/2014 | Thierry et al. | |
| 2015/0275354 A1 | 10/2015 | Oye et al. | |

\* cited by examiner

METHOD FOR CONTROLLABLY GROWING ZNO NANOWIRES

CROSS-REFERENCE TO RELATED APPLICATIONS

This application is a 371 U.S. National Stage of International Application No. PCT/SE2017/050246, filed Mar. 14, 2017, which claims priority to Swedish Application No. 1650356-7, filed on Mar. 16, 2016. The disclosures of each of the above applications are incorporated herein by reference in their entirety.

TECHNICAL FIELD

The present invention relates to a method for controllably growing ZnO nanowires, for example to be used in relation to field emission lighting. The invention also relates to a corresponding field emission cathode.

BACKGROUND OF THE INVENTION

Field Emission Light sources (FEL) are of interest as an alternative to LED technology. FEL technology is environmentally friendly, avoids the large blue portion of the visible spectrum as used in LEDs and can be far more energy efficient as compared to LEDs in the UVC region.

Field emission is a phenomenon which occurs when a very high electric field is applied to the surface of material. This field will give electrons enough energy such that the electrons are emitted from the material.

In prior art devices, a cathode is arranged in an evacuated chamber, having for example glass walls, wherein the chamber on its inside is coated with an electrically conductive anode layer. Furthermore, a light emitting layer is deposited on the anode. When a high enough potential difference is applied between the cathode and the anode thereby creating high enough electrical field strength, electrons are emitted from the cathode and accelerated towards the anode. As the electrons strike the light emitting layer, typically comprising a light powder, the light powder will emit photons. This process is referred to as cathodoluminescence.

One example of a light source applying field emission light source technology is disclosed in EP1709665. EP1709665 disclose a bulb shaped light source comprising a centrally arranged field emission cathode, further comprising an anode layer arranged on an inside surface of a glass bulb enclosing the field emission cathode. The disclosed field emission light source allows for omnidirectional emission of light, for example useful in relation to a retrofit light source implementation. In addition tube forms are also of interest. This requires relatively long cathodes to be manufactured. Other shapes are possible such as flat lamps.

Several different materials may be used to create the necessary nanostructures used in order to achieve the extremely high electrical fields needed to operate a field emission light source at reasonable applied voltages. Carbon Nano Tubes (CNT's) have been used extensively to demonstrate the technology. However CNTs may erode during operation and carbon is deposited onto the anode, and will degrade the performance. CVD based nano-diamond films are also used, and work well, but these require long processes and expensive equipment and are therefore expensive to make.

An alternative is to use zinc oxide (ZnO). This material shows very little degradation, is inexpensive, and nanostructures may be created in several ways.

ZnO has excellent electron emission properties, particularly from rod or wire nanostructures. A cheap and attractive fabrication technique is to simply oxidize zinc metal or a zinc-carrying alloy in an oxygen-carrying atmosphere at elevated temperatures.

In order for the light source to operate with a uniform emission of photons over a relatively large area, the light powder must be uniformly bombarded by electrons and thus the uniformity of the electron emitting nanostructure properties must be controlled over a relatively large cathode area. In addition, for the manufacturing of such cathodes the uniformity must also apply when manufacturing large amounts of cathodes at the same time, i.e. all cathodes must be relatively equal. These processes may take several hours in process time, so when manufacturing high volumes, the cathodes must be manufactured in large quantities at the same time (also referred to as "batch manufacturing").

In order to achieve a commercially attractive product, the properties of nanostructured elements must therefore be well controlled over large areas and it must be possible to manufacture large numbers of cathodes at the same time. Such considerations of uniformity over large areas or lengths as well as uniformity in larger reaction chambers are not found in present literature.

The present invention describes a highly uniform and reproducible zinc oxidation process yielding long ZnO nanowires with excellent and stable electron emission properties over long periods of time.

SUMMARY OF THE INVENTION

In view of above-mentioned and other drawbacks of the prior art, and the desired properties of a zinc oxidation process, it is an object of the present invention to provide an improved method of growing ZnO nanowires.

According to an aspect of the invention, the above object is at least partially achieved by a method for controllably growing zinc oxide nanowires on a surface of a structure by means of thermal oxidation, the structure comprising a zinc layer covering at least a portion of the structure, the method comprising: arranging the structure within a thermal oxidation chamber, the chamber having a gas inlet and a gas outlet for allowing a gas flow through the chamber, providing a gas comprising an oxygen-carrying precursor through the gas inlet of the chamber; and controlling a concentration of oxygen along the surface of the structure by controlling a temperature within the chamber and controlling a gas flow of the gas comprising the oxygen-carrying precursor through the chamber such that steady-state conditions are achieved between an oxygen consumption rate by a growing oxide on the surface of the structure and the decomposition rate of the oxygen-carrying species within the chamber, thereby maintaining the same zinc oxidation conditions along the surface of the structure within the chamber.

In the present context, the term nanowire refers to a structure where at least one dimension is on the order of up to a few hundreds of nanometers. Such nanowires may also be referred to as nanotubes, nanorods, nanopencils, nanospikes, nanoneedles, and nanofibres.

Moreover, the structure serving as a base for nanowire growth may be metallic, semiconducting or insulating, and may have any shape and form. The structure may also be a layered or coated structure, and the structure may be either mechanically rigid or flexible. Example structures will be discussed in further detail in the following.

A main objective of the manufacturing method according to various embodiments of the invention is to provide an ensemble of ZnO nanowires having sufficiently uniform properties to be used as field emitters, for example in a lighting application. Field emission occurs when a large enough electrical field is applied to a material. For a flat surface, typical field strengths are in the order of a few Gigavolt/meter. In practical applications these voltages are far too high and therefore several steps are taken to enhance the local field strength to achieve local field emission. Using a tubular structure as an example, the first amplification comes from the cylindrical symmetry where the electrical field E is given by $$E(r) = \frac{V}{r \ln\left(\frac{R}{r}\right)}$$

where V is the applied voltage, r is the radius of the cathode and R is the radius of the anode tube.

Using a typical example of R=15 mm and r=0.5 mm the resulting field strengths at V=1000V becomes 0.59 MV/m, to be compared with a corresponding flat structure with the same distance (14.5 mm) giving a field strength of 0.069 MV/m.

The second step of the field amplification can be provided by using nanostructures which provide extremely sharp tips that will enhance the field further. The emission for a single emitter follows the Fowler-Nordheim equation $$I = A_r a \frac{\beta^2 E^2}{\phi} e^{-\frac{b\phi^{3/2}}{\beta E}},$$

where $A_r$ is the effective emitter area, a is the first Fowler-Nordheim constant;

$$a = 1.54 \times 10^{-6} \left[\frac{AeV}{V^2}\right]$$

b is the second Fowler-Nordheim constant;

$$b = 6.83 \times 10^9 \left[\frac{V}{m\ eV^{\frac{3}{2}}}\right]$$

Ø is the work function in eV (5.1-5.3 eV for ZnO) and β is a dimensionless enhancement factor. As long as the emitters are operating with field emission, a plot of $$\ln\left(\frac{I}{V^2}\right) \text{ vs. } \frac{1}{V}$$

will give a straight line, and β can be found from the slope.

The enhancement factor β will depend on the morphology of the emitter. In a first order approximation β will be depending on the height h and the sharpness r of the nanostructure $$\beta \propto \frac{h}{r}$$

In addition, the enhancement factor will be influenced by the distance (d) to the next emitter.

Oxidation is a large scale method for manufacturing nanostructures, which provides a good cost efficiency. However, when using an oxidation method that will provide a very large number of nanostructures it is obvious that the individual nanostructures will not be exactly the same. The geometrical parameters h, r and d will all have distributions and therefore β will have a distribution and the total current of all the emitters will essentially be the integral of a distribution. This may be expressed as $$I = \frac{aE^2}{\phi} \sum_1^N A_i \beta_i^2 e^{-\frac{b\phi^{\frac{3}{2}}}{\beta_i E}}$$

where the subscript i denotes the specific properties of each specific emitter, or in this case of each ZnO nanowire.

As the Fowler Nordheim equation above in practice is very steep, only a portion of the distribution of nanowires will be operational. When a field emitting device is turned on for the first time, the (relatively few) emitters that turn on early may become overloaded and destroyed due to e.g. ohmic heating. Once a region of the distribution is reached where the emitters are large enough to survive the applied field and the resulting emission current, only those with appropriate characteristics will be operating—in essence those with lower $\beta_i$ will not emit any current of relevance.

The above means that the geometric distributions of the nanowire properties must be controlled in order to ensure there are roughly the same amount of emitters per unit area with similar characteristics within the operational range over the entire operational area of the cathode, and also that the properties can be repeatable between process runs. Accordingly, it is therefore of high importance to control the distribution of the nanowire properties.

During thermal oxidation, many metals and metal alloys first form a surface oxide layer having a morphology that may change with the oxidation conditions (temperature and oxygen activity at the metal/atmosphere interface). Upon increasing the oxidation temperature a sequence of oxide layer structures is often obtained. Starting with a grain structure, covering the metal or alloy surface, a transition to whisker or surface wire structure can be observed. At even higher temperatures the oxide surface morphology becomes flatter and the surface wires/rods/whiskers disappear. This means there is a certain oxidation temperature range allowing for growth for zinc oxide nanowires. The dimensions of the whiskers/wires depend on the oxidation conditions and the properties of the underlying zinc layer but also on the inherent properties of the oxide.

Zinc oxide is an n-type semiconductor with vacancies in the $Zn^{2+}$ ion positions. After growth of the initial oxide layer, covering the Zn-surface with a thin oxide layer, the continued oxidation process proceeds by means of $Zn^{2+}$ diffusion via $Zn^{2+}$ vacancies through the oxide layer and/or via oxide grain boundaries, i.e., the growth of the oxide occurs at the oxide/atmosphere interface. The zinc oxidation rate is basically determined by the supply rate of zinc through the oxide layer to the zinc/atmosphere interface, the supply rate of oxygen-carrying species or the chemical reaction rates of or between species. For high supply rates of oxygen or oxygen-carrying species in comparison with the supply rate of zinc to the oxide/atmosphere interface, i.e. when the oxidation process is not oxygen limited, the oxide layer can be assumed to grow externally while maintaining a relatively flat surface structure. However, when the oxygen supply rate is limiting the reactions, i.e. in an oxygen limited reaction, the oxide growth will occur in a concentration gradient developed in the atmosphere perpendicularly to the metal surface i.e., a more instable growth front has been established and conditions for nanowire growth has been reached. In summary the interaction between two opposite fluxes (zinc and oxygen, respectively) determines to a large extent the surface structure of the formed oxide. The zinc flux is basically determined by the temperature while the oxygen flux is determined not only by the temperature but also by the gas flow rate, concentrations/partial pressures of the gaseous species, the total pressure and the chemical kinetics producing the oxidizing species, i.e. the decomposition of an oxygen-carrying precursor.

The oxygen activity at the oxide/atmosphere interface during the growth of the nanowires determines also the electron work function of the material and hence the electron emission properties. Moreover, the resistivity of the nanowires will also be affected by the oxidation process. Zinc oxide is a non-stoichiometric n-type semiconductor whose chemical composition is determined by the oxygen activity in the vapor at the zinc oxide/vapor interface.

Many different oxygen-carrying precursors can be used to oxidize zinc metal. However, in order to establish an oxygen concentration gradient close to the substrate, favoring nanowire growth, oxygen donor reactions are preferred. Oxygen-donor reactions allow a precise control of the oxygen concentration or pressure in the oxidation chamber even at very low levels.

The oxidation process described herein may include oxygen donor reactions like $$CO_2 \rightarrow CO + O$$

$$N_2O \rightarrow N_2 + O$$

$$H_2O \rightarrow H + OH \rightarrow H_2 + O$$

In order to favor the donor reactions and to control the homogeneous reactions in the vapor, i.e., the oxygen supply rate to the growth interface, a hot-wall oxidation reactor is preferably used. The use of a hot-wall reactor also facilitates scaling up of the oxidation process.

Even if the oxidation process includes a complicated interplay between various species and transport processes in a solid material (the oxide) and in the vapor, only two stages in the process will be discussed below. As described above the initial formation of the covering zinc oxide layer is crucial and paves the way for the later formation of the nanowires. By controlling the thickness of the primary formed oxide layer, a transition from a flat oxide grain structure to a nanowire growth mode can be induced. Since the initial formation of the oxide layer is important for the subsequent nanowire growth, the oxide layer and nanowire formation steps are favorably controlled by using different temperatures in the steps. This means that the ramping of the temperature must be controlled in order to be able to grow nanowires of desired dimensions (lengths and diameters) and properties.

From the above it is clear that, in order to achieve a stable, high volume scalable nanostructure manufacturing process form manufacturing field emitters that will be suitable for large area cathodes the geometric distribution properties of the nanostructure must be controlled, and in order to achieve this, the partial pressures of the involved chemical gaseous species is preferably controlled accurately over a large volume in the oxidation chamber.

Therefore, the use of oxygen-carrying precursors that will thermally decompose slowly and controllably may be used and a balance between the decomposition rate, the gas flow, and other gas dynamics may be established and the aforementioned gradients close to the oxidation surface may be controlled, yielding the desired geometrical distributions.

The present invention is based on the understanding that ZnO nanowires having uniform properties can be achieved by performing thermal oxidation and controlling the oxidation process to produce steady-state conditions between oxygen consumption rate by the growing oxide surface and the decomposition rate of oxygen-carrying species within the oxidation chamber. In the present context, steady state conditions can be considered to mean that the consumption rate of oxygen is matched by the decomposition rate such that the oxidation process is substantially uniform, in the reactor volume where oxidation takes place, over time throughout the oxidation process. Accordingly, the process parameters are controlled to achieve the above steady state, i.e. to provide the correct amount of the oxygen-carrying precursor, at the appropriate temperature and pressure, so that the oxidation process occurs at the same conditions in the axial direction throughout the reaction chamber over time. This in turn results in ZnO nanowires having a high degree of uniformity over the surface of the substrate as well as a high degree of uniformity between different substrates within the reactor volume.

According to one embodiment of the invention, the temperature and the gas-flow may be controlled to provide substantially uniform growth conditions at the entire surface of the structure, at a given time. To achieve uniform growth conditions, at a given point in time, it is preferable that the relation between Zn and O at the surface is substantially the same throughout the oxidation chamber, or at least over the surface of the structure to be oxidized. This can be achieved by controlling the gas flow of the gas containing the oxygen-carrying precursor and the temperature in the oxidation chamber based on known properties of the chamber.

According to one embodiment of the invention, the supplied gas may advantageously comprise a plurality of different oxygen carrying precursors. Moreover, a plurality of different oxygen carrying precursors may be provided by means of one or more different gasses.

According to one embodiment of the invention, the method may further comprise controlling a gas pressure to provide substantially uniform growth conditions at the entire surface of the structure, at a given time.

According to one embodiment of the invention, the method may further comprise controlling a gas flow such that a resulting concentration of oxygen is substantially uniform over the entire surface of the structure.

The influence that the gas pressure and gas flow has on the ZnO nanowire growth will be discussed in the following detailed description.

According to various embodiments of the invention, at least one oxygen-carrying precursor may be selected from a group comprising of $O_2$, $CO_2$, $N_2O$ and $H_2O$. The different oxygen-carrying precursors may have different decomposition rates, in turn leading to different concentrations of free oxygen available for the oxidation process. It should also be noted that the decomposition rate typically is temperature dependent. Accordingly, the choice of oxygen-precursor may be based on a particular substrate and on the desired resulting properties of the ZnO nanowires. In other words, the achievable range of the oxygen concentration in the chamber can be controlled by selecting the appropriate oxygen-precursor, where a selected oxygen-precursor can provide a range of oxygen concentrations. The specific oxygen concentration within that range is determined by process parameters such as temperature and pressure.

According to one embodiment of the invention, the method may further comprise selecting a concentration of the oxygen precursor of the gas provided to the chamber. In addition to selecting which oxygen-carrying precursor to use as discussed above, the oxygen concentration in the chamber can be further controlled by controlling the concentration of the oxygen-carrying precursor. The gas provided to the oxidation chamber may for example be a gas mixture comprising at least one of nitrogen and argon. However, other inert gases may also be used in the gas mixture. Thereby, by controlling the mix of the gas provided to the oxidation chamber, the oxygen concentration can be controlled continuously during the process, for example to be adapted to different growth stages of the ZnO nanowires.

According to one embodiment of the invention, the temperature is controlled according to a predetermined temperature curve, where temperature curve is referring to a predetermined temperature as a function of time. Thereby, a repeatable and stable oxidation process is provided which is capable of producing a large number of ZnO nanowires, and which can be consistently repeated for a large number of separate process runs.

In one embodiment, the temperature curve may be selected based on a decomposition rate of the oxygen-carrying precursor. The temperature curve may also be tuned to other process parameters such as gas flow and gas pressure, together providing a manufacturing method which provides ZnO nanowires having the desired uniformity.

According to one embodiment of the invention, the temperature curve may comprise ramping up the temperature to an oxidation temperature using a fixed ramp, maintaining the oxidation temperature for a predetermined time, and ramping down the temperature using a fixed ramp. Thereby, a steady state ramp over a predetermined period of time may be used for ramping up and down the temperature to and from the constant oxidation temperature.

According to one embodiment of the invention, the temperature curve may comprise: ramping up the temperature to a first oxidation temperature using a first ramp rate, performing thermal oxidation starting at the first oxidation temperature for a first period of time to form an initial oxide layer, ramping up the temperature to a second oxidation temperature using a second ramp rate, performing thermal oxidation at the second oxidation temperature for a predetermined period of time to initialize and maintain nanowire growth, ramping up the temperature to a third oxidation temperature using a third ramp rate and performing thermal oxidation during the temperature ramp to grow nanowires; and when the third oxidation temperature is reached, ramping down the temperature to end the oxidation using a fourth ramp rate.

Moreover, the temperature curve may comprise a fourth stage, after the third stage. During the fourth stage, the surface properties of the ZnO nanostructures may be modified and controlled by introducing for example a small amount of water vapor, and/or a doping agent, such as Al. By doping the ZnO nanostructures, the field emission properties can be improved. In this embodiment, the temperature is ramped down or up from the third temperature to a fourth temperature, using a fourth temperature ramp. The fourth temperature is then held constant for a preselected period of time after which the temperature is ramped down to room temperature using a final temperature ramp.

Thereby, the temperature curve defines the three main stages of the ZnO nanowire growth: the first stage forming a substantially planar initial oxide layer forming a base for subsequent nanowire growth, the second stage initializing the nanowire growth, and the third stage where the ZnO nanowires are grown and the length of the nanowires are grown and determined. The second stage can be referred to as a nucleation and growth stage of the nanowires, where the population density of ZnO nanowires can be controlled by controlling the relevant process parameters. Moreover, for a constant temperature and a constant oxygen concentration, the growth process is in principle self-limiting as a result of reduced Zn diffusion to the oxide/atmosphere interface with increasing oxide thickness. Accordingly, the temperature is increased during the third stage to facilitate continued nanowire growth, thereby controlling the final length of the nanowires.

According to one embodiment of the invention, the third oxidation temperature within the chamber may advantageously be equal to or lower than 625° C. It has been found that ZnO nanowires having desirable uniformity and emission properties can be manufactured when the highest oxidation temperature does not exceed 625° C. A too high oxidation temperature also limits the range of possible substrate materials.

According to one embodiment of the invention, a pressure within the chamber may advantageously be at maximum 1 atm. By performing the oxidation at a pressure not exceeding 1 atm, there is no need for the specific pump equipment and/or oxidation chamber required for operating at elevated pressure. Thereby, the manufacturing process is relatively simple and straightforward, and the repeatability of the process may also be increased due to the relative ease of maintaining the same conditions for subsequent runs of the process.

According to one embodiment of the invention, the method may further comprise preparing the structure by applying a predetermined thickness of a ZnO layer to the surface of the structure. In some cases, and for some substrate materials, is may be advantageous to apply a ZnO layer prior to the start of the thermal oxidation process. Such an oxide layer can for example be deposited using evaporation, sputtering, or chemical oxidation in a solution.

According to one embodiment of the invention, the structure may comprise at least one of copper and brass, and the structure may for example comprise a wire. The structure may also be a planar substrate such a s a plate. The structure may additionally be comprised of a wire mesh.

According to one embodiment of the invention, the method may comprise preparing the structure by electroplating the structure. An electroplated layer may serve as a seed layer for facilitation subsequent ZnO nanowire growth. The electroplated layer may advantageously be a zinc layer.

According to one embodiment of the invention, a length of the ZnO nanowires may be selected to be between 2-100 um and a diameter of the ZnO nanowires may be selected to be between 2-100 nm.

According to another aspect of the invention, there is also provided a field emission light source comprising a structure provided with ZnO nanowires grown according to any one of the embodiments of the above described method. Furthermore, the field emission light source may be a UV light source.

Further features of, and advantages with, the present invention will become apparent when studying the appended claims and the following description. The skilled addressee realize that different features of the present invention may be combined to create embodiments other than those described in the following, without departing from the scope of the present invention.

BRIEF DESCRIPTION OF THE DRAWINGS

The various aspects of the invention, including its particular features and advantages, will be readily understood from the following detailed description and the accompanying drawings, in which.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled addressee. Like reference characters refer to like elements throughout.

Figure 1:
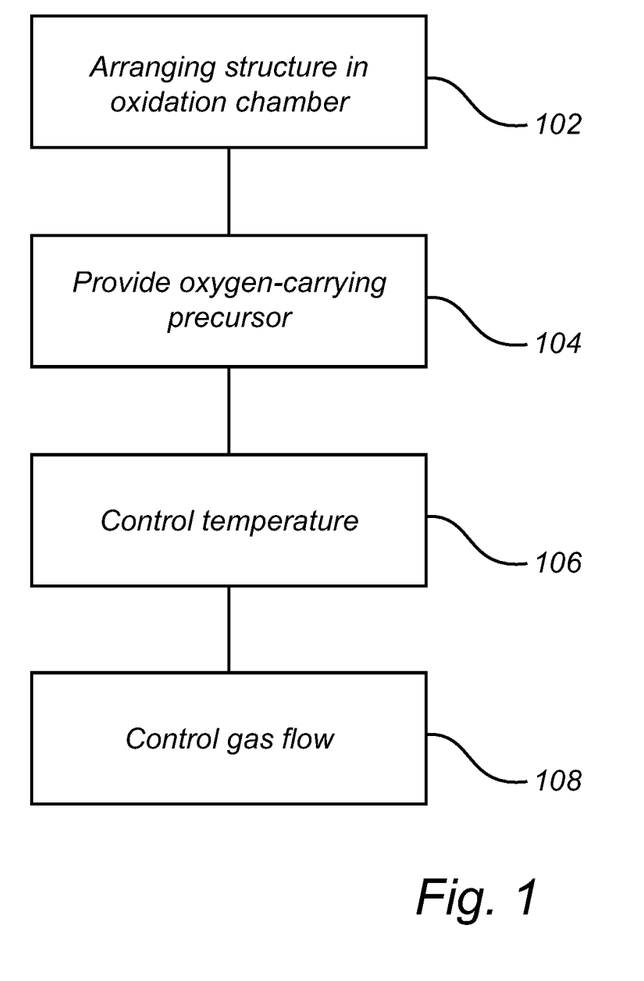
FIG. 1 is a flow chart outlining the general steps of a method according to an embodiment of the invention.
Figure 2:
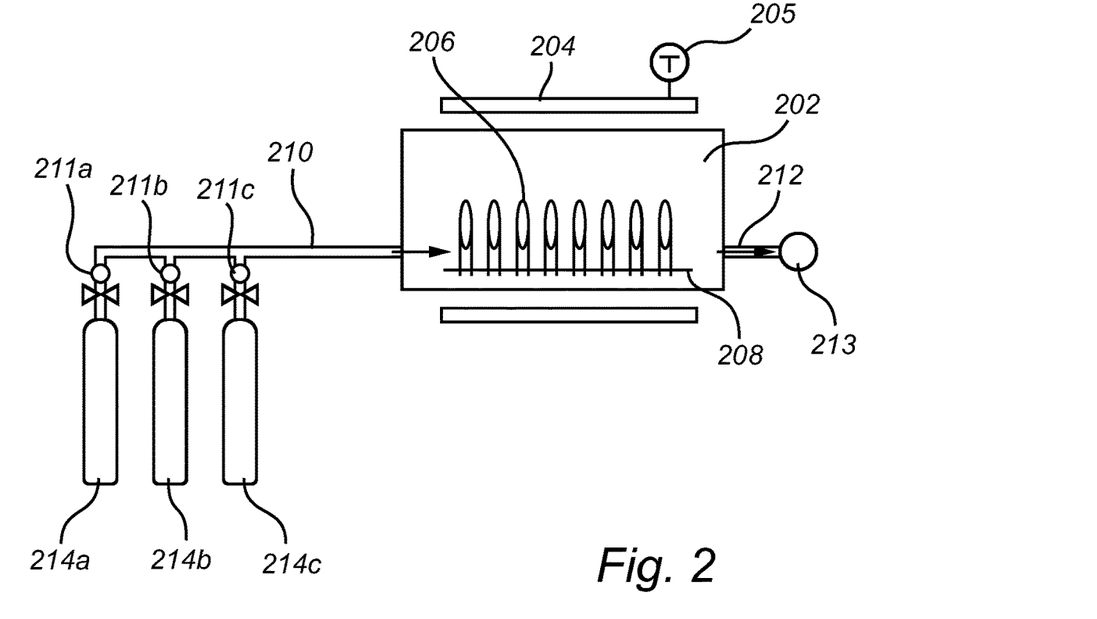
FIG. 2 is a schematic illustration of an oxidation chamber for performing a method according to various embodiments of the invention.

FIG. 1 is a flow chart outlining the general steps of the invention, which will be described with reference to the thermal oxidation chamber schematically illustrated in FIG. 2.

In a first step 102, a structure to be oxidized is placed in the thermal oxidation chamber 202. The thermal oxidation chamber 202 may for example be a quartz tube of a hot-wall furnace, where heating elements 204 arranged outside of the chamber heat the environment within the chamber 202. A temperature controller 205 controls the heating elements 204 to provide a controlled temperature within the oxidation chamber. In a hot-wall furnace, the temperature can be uniform throughout the chamber where the structures 206 are placed. The structures are here illustrated as wafers 206 arranged in a carrier 208. Wafers are typically used as substrates to enable large scale manufacturing in semiconductor processes. However, the structures to be oxidized may also have other shapes, such as wire-shaped. Moreover, the structures to be oxidized may also be placed on carrier wafers to simplify handling.

The oxidation chamber 202 comprises a gas inlet 210 and a gas outlet 212 allowing a gas to flow through the chamber 202. To start the oxidation, at least one oxygen carrying-precursor is provided from one or more of the gas containers 214a-c. Throughout the following description, it is to be understood that one ore more oxygen-carrying precursors may be used. A gas container may also comprise an inert gas for providing a gas mixture comprising an oxygen-carrying precursor and an inert gas, thereby controlling the oxygen-carrying precursor concentration in the chamber 202. The oxygen-carrying precursor may be selected from the group comprising $O_2$, $CO_2$, $N_2O$ and $H_2O$, and the inert gas may be $N_2$. Each gas container 214a-c is connected first to a mass flow controller (MFC) 211a-c for accurately controlling the gas flow mixture into the oxidation chamber 202. A pump 213 is connected to the outlet for pumping gas out of the oxidation chamber 202.

Once the structures are placed in the oxidation chamber 202, a gas comprising an oxygen-carrying precursor is provided 104 in the chamber. The heating of the chamber 202 may be initiated prior to providing the oxygen precursor. For example, an inert gas may be provided to the chamber 202 while the chamber 202 and structures 206 are being heated to reach the desired oxidation temperature.

After providing the oxygen precursor, the temperature 106 and the gas flow 108 are controlled to produce steady-state conditions between oxygen consumption rate by the growing oxide surface and the decomposition rate of oxygen-carrying species within the chamber. The consumption rate of oxygen varies over time throughout the oxidation process. Therefore, it is important to control the process and the decomposition of the oxygen-carrying precursor such that the concentration of free oxygen is appropriate for the different oxidation stages included in the overall process. Details concerning the different stages of the oxidation process, as well as the use of ZnO nanowires as field emitters, will be discussed in the following.

Figure 3A:
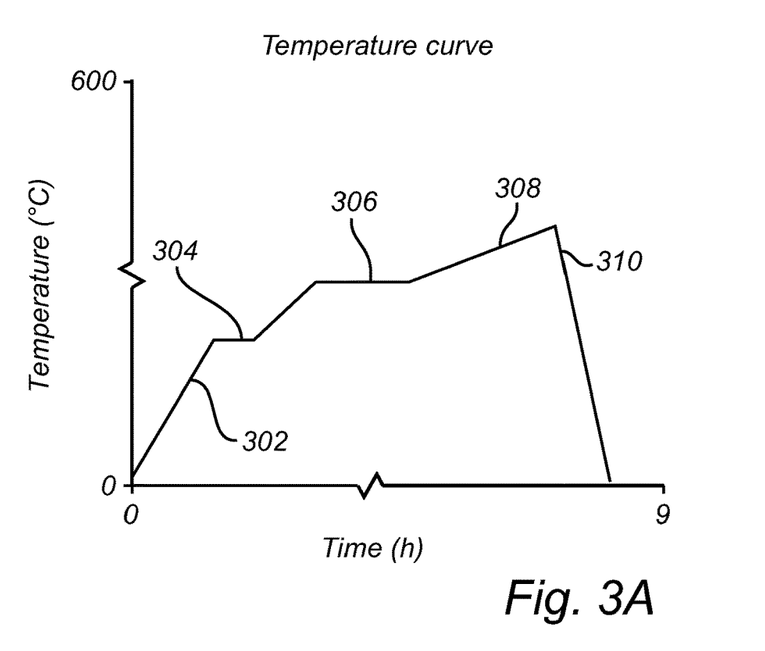
FIGS. 3A-B conceptually illustrate a temperature curves according to embodiments of the invention.

FIG. 3A is an example temperature curve outlining the different stages in an oxidation process. Prior to oxidation, the structures to be oxidized are prepared. As an example, the base cathode structure may be a Cu wire which is electroplated with zinc thereby forming a zinc layer on the wire. Next, the prepared wire is arranged in a holder and arranged in the oxidation chamber.

In a non-limiting example of the invention, the gas-flow related process parameters of the thermal oxidation process may be approximately, $CO_2$=20 sccm, $N_2$=400 sccm and the pressure P(tot)=1 atm.

First the temperature is ramped up 302 from room temperature to the first oxidation temperature 304, typically in the range of 350-450° C. using a first ramp rate. At the first oxidation temperature 304, the initial oxide layer is formed. After initial oxide formation, the temperature is ramped up to a second oxidation temperature 306, typically in the range of 500-550° C., using a second ramp rate. Here, thermal oxidation is performed for a predetermined period of time (2 h in the present example) to initialize and continue to drive nanowire growth. Next the temperature is slowly ramped up 308 to a third and final oxidation temperature, typically in the range of 525-575° C., using a third ramp rate. In the present example, the temperature is ramped over a period of about 5 h.

Once ZnO nanowire growth has been initiated, the growth rate gradually slows down due to the increasing ZnO thickness, since Zn must diffuse through the ZnO layer to the oxide/atmosphere interface for reacting with oxygen. Therefore, the temperature is slowly increased to increase the diffusion rate of Zn in order to maintain the desired oxidation conditions.

Figure 3B:
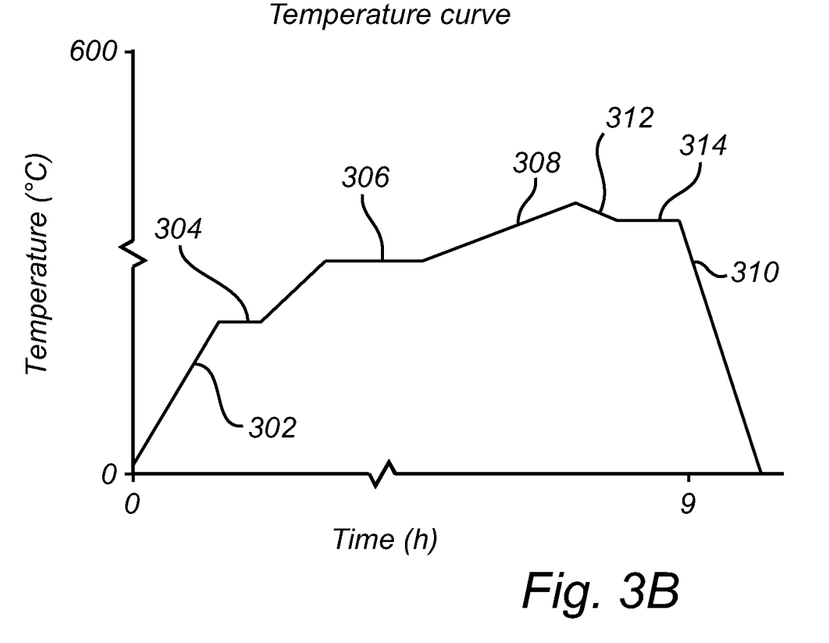

An alternative temperature curve is illustrated in FIG. 3B, where a fourth stage is added, comprising ramping down or up 312 the temperature, after the third temperature has been reached, to a fourth temperature 314 which is maintained constant for a predetermined period of time before ramping down 310 to room temperature. During the fourth stage, the surface properties of the ZnO nanostructures may be modified, for example by introducing a small amount of water vapor in the oxidation chamber and/or by introducing a doping agent comprising for example Al.

Additionally it shall be noted that in some arrangements a simple steady state ramp over a predetermined period of time may be used.

In summary, the present invention relates to a method for controllably growing highly uniform zinc oxide nanowires on a surface of a structure by means of thermal oxidation.

By means of the invention it is possible to optimize the growth process of ZnO nanowires to form field emitters having a high uniformity.

It should be noted that the specific process parameters depends for example on the properties of the oxidation chamber, the oxygen-carrying precursor used, the geometry of the structures to be oxidized and the desired properties of the resulting ZnO nanowires. Due to the complex interplay between different mechanisms, depending on a range of process parameters, the specific process parameters are best determined empirically for a given set of conditions and for a specific desired result.

Although the figures may show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps. Additionally, even though the invention has been described with reference to specific exemplifying embodiments thereof, many different alterations, modifications and the like will become apparent for those skilled in the art.

Variations to the disclosed embodiments can be understood and effected by the skilled addressee in practicing the claimed invention, from a study of the drawings, the disclosure, and the appended claims. Furthermore, in the claims, the word "comprising" does not exclude other elements or steps, and the indefinite article "a" or "an" does not exclude a plurality.

The invention claimed is:

1. A method for controllably growing zinc oxide (ZnO) nanowires on a surface of a structure by means of thermal oxidation, the structure comprising a zinc layer covering at least a portion of the structure, the method comprising:
    arranging the structure within a thermal oxidation chamber, the chamber having a gas inlet and a gas outlet for allowing a gas flow through the chamber;
    providing a gas comprising an oxygen-carrying precursor through the gas inlet of the chamber; and
    controlling a concentration of oxygen along the surface of the structure by:
    controlling a temperature within the chamber; and
    controlling a gas flow of the gas comprising the oxygen-carrying precursor through the chamber,
    such that steady-state conditions are achieved between an oxygen consumption rate by a growing oxide on the surface of the structure and the decomposition rate of the oxygen-carrying species within the chamber, thereby maintaining the same zinc oxidation conditions along the surface of the structure within the chamber.

2. The method according to claim 1, wherein said gas comprises a plurality of oxygen carrying precursors.

3. The method according to claim 1, further comprising controlling a gas pressure to provide substantially uniform growth conditions at the entire surface of the structure, at a given time.

4. The method according to claim 1, further comprising controlling the gas flow such that a resulting concentration of oxygen is substantially uniform for the entire surface of the structure.

5. The method according to claim 1, wherein the oxygen-carrying precursor is selected from a group comprising of $O_2$, $CO_2$, $N_2O$ and $H_2O$.

6. The method according to claim 1, further comprising selecting a concentration of the oxygen precursor of the gas provided to the chamber.

7. The method according to claim 1, wherein the gas is a gas mixture further comprising at least one of nitrogen and argon.

8. The method according to claim 1, wherein the temperature is controlled according to a predetermined temperature curve.

9. The method according to claim 8, wherein the temperature curve is selected based on a decomposition rate of the oxygen-carrying precursor.

10. The method according to claim 8, wherein the temperature curve comprises ramping up the temperature to an oxidation temperature using a fixed ramp, maintaining the oxidation temperature for a predetermined time, and ramping down the temperature using a fixed ramp.

11. The method according to claim 8, wherein the temperature curve comprises:
    ramping up the temperature to a first oxidation temperature using a first ramp rate;
    performing thermal oxidation starting at the first oxidation temperature for a first period of time to form an initial oxide layer;
    ramping up the temperature to a second oxidation temperature using a second ramp rate;
    performing thermal oxidation at the second oxidation temperature for a predetermined period of time to initialize and to maintain nanowire growth;
    ramping up the temperature to a third oxidation temperature using a third ramp rate and performing thermal oxidation during the temperature ramp to grow nanowires; and
    when the third oxidation temperature is reached, ramping down the temperature to end the oxidation using a fourth ramp rate.

12. The method according to claim 11, further comprising, when the third oxidation temperature is reached, ramping the temperature up or down to a fourth temperature using a fourth temperature ramp, and maintaining the fourth temperature for a predetermined period of time, before ramping down the temperature to end the oxidation using a fifth ramp rate.

13. The method according to claim 1, wherein the third oxidation temperature within the chamber is equal to or lower than 625° C.

14. The method according to claim 1, wherein a pressure within the chamber is a maximum of 1 atm.

15. The method according to claim 1, further comprising:
    preparing the structure by applying a predetermined thickness of a ZnO layer to the surface of the structure.

16. The method according to claim 1, wherein the structure comprises at least one of copper and brass.

17. The method according to claim 1, wherein the structure comprises a wire, a mesh or a plate.

18. The method according to claim 1, wherein a length of the ZnO nanowires is selected to be between 2-100 um.

19. The method according to claim 1, wherein a diameter of the ZnO nanowires is selected to be between 5-100 nm.

20. A field emission light source comprising a structure provided with ZnO nanowires grown according to claim 1.

21. The field emission light source according to claim 19, wherein the field emission light source is a UV light source.

* * * * *